United States Patent
Daikoku et al.

(10) Patent No.: US 10,450,671 B2
(45) Date of Patent: Oct. 22, 2019

(54) SIC SINGLE CRYSTAL AND METHOD FOR PRODUCING SAME

(71) Applicants: TOYOTA JIDOSHA KABUSHIKI KAISHA, Toyota-shi, Aichi (JP); NIPPON STEEL & SUMITOMO METAL CORPORATION, Tokyo (JP)

(72) Inventors: Hironori Daikoku, Susono (JP); Motohisa Kado, Gotenba (JP); Kazuhito Kamei, Tokyo (JP); Kazuhiko Kusunoki, Tokyo (JP)

(73) Assignees: TOYOTA JIDOSHA KABUSHIKI KAISHA, Toyota (JP); NIPPON STEEL & SUMITOMO METAL CORPORATION, Tokyo (JP)

( * ) Notice: Subject to any disclaimer, the term of this patent is extended or adjusted under 35 U.S.C. 154(b) by 166 days.

(21) Appl. No.: 15/023,981

(22) PCT Filed: Aug. 27, 2014

(86) PCT No.: PCT/JP2014/072493
§ 371 (c)(1),
(2) Date: Mar. 22, 2016

(87) PCT Pub. No.: WO2015/045716
PCT Pub. Date: Apr. 2, 2015

(65) Prior Publication Data
US 2016/0237590 A1 Aug. 18, 2016

(30) Foreign Application Priority Data

Sep. 27, 2013 (JP) .................................. 2013-202687

(51) Int. Cl.
*C30B 19/10* (2006.01)
*C30B 29/36* (2006.01)
(Continued)

(52) U.S. Cl.
CPC ................ *C30B 19/10* (2013.01); *C30B 9/10* (2013.01); *C30B 19/02* (2013.01); *C30B 19/062* (2013.01);
(Continued)

(58) Field of Classification Search
CPC ..... C30B 19/02; C30B 19/062; C30B 19/068; C30B 19/08; C30B 19/10; C30B 19/12;
(Continued)

(56) References Cited

U.S. PATENT DOCUMENTS

2005/0183657 A1* 8/2005 Kusunoki ............... C30B 11/00
117/2
2006/0292057 A1* 12/2006 Nakamura ............... C30B 9/00
423/446

(Continued)

FOREIGN PATENT DOCUMENTS

CN 104471118 A 3/2015
EP 2 876 190 A1 5/2015
(Continued)

OTHER PUBLICATIONS

Mokhov, E.N. "Growth of silicon carbide bulk crystals by the sublimation sandwich method ", Materials Science & Engineering B, Elsevier Sequoia, Lausanne, vol. 46, No. 1-3, p. 317-323, Apr. 1, 1997.

*Primary Examiner* — Hua Qi
(74) *Attorney, Agent, or Firm* — Oliff PLC

(57) ABSTRACT

Provided is a SiC single crystal that has a large growth thickness and contains no inclusions. A SiC single crystal grown by a solution process, wherein the total length M of the outer peripheral section formed by the {1-100} faces on the {0001} growth surface of the SiC single crystal, and the length P of the outer periphery of the growth surface of the SiC single crystal, satisfy the relationship M/P≤0.70, and the
(Continued)

length in the growth direction of the SiC single crystal is 2 mm or greater.

9 Claims, 10 Drawing Sheets

(51) Int. Cl.
| | | |
|---|---|---|
| C30B 9/10 | (2006.01) | |
| C30B 19/02 | (2006.01) | |
| C30B 19/06 | (2006.01) | |
| C30B 19/12 | (2006.01) | |
| H01L 21/02 | (2006.01) | |
| H01L 29/04 | (2006.01) | |
| H01L 29/16 | (2006.01) | |
| C30B 19/08 | (2006.01) | |

(52) U.S. Cl.
CPC ............ *C30B 19/068* (2013.01); *C30B 19/08* (2013.01); *C30B 19/12* (2013.01); *C30B 29/36* (2013.01); *H01L 21/02529* (2013.01); *H01L 21/02598* (2013.01); *H01L 21/02609* (2013.01); *H01L 21/02628* (2013.01); *H01L 29/045* (2013.01); *H01L 29/1608* (2013.01)

(58) Field of Classification Search
CPC ..... C30B 29/36; C30B 9/10; H01L 21/02529; H01L 21/02598; H01L 21/02609; H01L 21/02628; H01L 29/045; H01L 29/1608
See application file for complete search history.

(56) References Cited

U.S. PATENT DOCUMENTS

| | | |
|---|---|---|
| 2012/0160153 A1 | 6/2012 | Ishii et al. |
| 2013/0305981 A1* | 11/2013 | Kamei .................... C30B 19/06 117/13 |
| 2015/0013590 A1 | 1/2015 | Kado et al. |
| 2015/0167196 A1 | 6/2015 | Kado et al. |

FOREIGN PATENT DOCUMENTS

| | | | |
|---|---|---|---|
| EP | 2985369 A1 | 2/2016 | |
| JP | 04321590 A * | 11/1992 | |
| JP | H06-227886 A | 8/1994 | |
| JP | 2012-140267 A | 7/2012 | |
| JP | WO 2012090951 A1 * | 7/2012 | ............ C30B 19/06 |
| JP | 2013-147397 A | 8/2013 | |
| WO | 2014/013773 A1 | 1/2014 | |

* cited by examiner

<11-20>

(a)

(b)

10 mm 5 mm 5 mm 5 mm 2 mm

OUTER PERIPHERY

SIC SINGLE CRYSTAL AND METHOD FOR PRODUCING SAME

TECHNICAL FIELD

The present invention relates to a SiC single crystal that is suitable for a semiconductor element, and to a method for producing it, and more specifically it relates to a high-quality SiC single crystal with no inclusions and to a method for producing a high-quality SiC single crystal with no inclusions, by a solution process.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials such as Si single crystals and GaAs single crystals, and being considered ever more promising as next-generation semiconductor materials for a wide range of applications including power device materials that allow high power control and energy saving to be achieved, device materials for high-speed large volume information communication, high-temperature device materials for vehicles, radiation-resistant device materials, and the like.

Typical growth processes for growing SiC single crystals that are known in the prior art include gas phase processes, the Acheson method and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved into the molten liquid, and then a SiC crystal layer is deposited and grown on a seed crystal substrate set in the low temperature zone. Solution processes can be expected to reduce defects since crystal growth is carried out in a state of near thermal equilibrium, compared to gas phase processes. In recent years, therefore, several methods for producing SiC single crystals by solution processes have been proposed, and for example, there has been proposed a method for producing a SiC single crystal to obtain a SiC single crystal at a rapid growth rate (PTL 1).

CITATION LIST

Patent Literature

[PTL 1] Japanese Unexamined Patent Publication No. 2013-147397

SUMMARY OF THE INVENTION

Problems to be Solved by the Invention

However, in the methods for producing SiC single crystals by solution processes that have been proposed in the prior art, inclusions have been generated when growing SiC single crystals having large growth thicknesses.

Means for Solving the Problems

The present invention relates to a SiC single crystal grown by a solution process, wherein the total length M of the outer peripheral section formed by the {1-100} faces on the {0001} growth surface of the SiC single crystal, and the length P of the outer periphery of the growth surface of the SiC single crystal, satisfy the relationship $M/P \leq 0.70$, and the length in the growth direction of the SiC single crystal is 2 mm or greater.

The invention further relates to a method for producing a SiC single crystal, in which a SiC seed crystal substrate held on a seed crystal holding shaft is contacted with a Si—C solution having a temperature gradient such that the temperature decreases from the interior toward the surface, in a crucible, to grow a SiC single crystal, wherein the method comprises:

growing the SiC single crystal from the {0001} face of the seed crystal substrate so that the grown SiC single crystal has a length in the growth direction of 2 mm or greater, and reducing the heat loss from the <11-20> direction to be lower than the heat loss from the <1-100> direction, and wherein the ratio S/C of the diameter S of the seed crystal substrate to the inner diameter C of the crucible satisfies the relationship $0.17 < S/C < 1.0$.

Effect of the Invention

According to the invention, it is possible to obtain a SiC single crystal that has a large growth thickness and contains no inclusions.

DESCRIPTION OF EMBODIMENTS

Throughout the present specification, the indication "-1" in an expression, such as "(1-100) face", is used where normally a transverse line is placed over the numeral.

During growth of a SiC single crystal by a solution process, inclusions are often generated in the SiC grown crystal at the growth interface, due to instability of the growth interface.

As used herein, "inclusions" refers to components of the Si—C solution used for SiC single crystal growth incorporated into the grown crystal.

Figure 1:
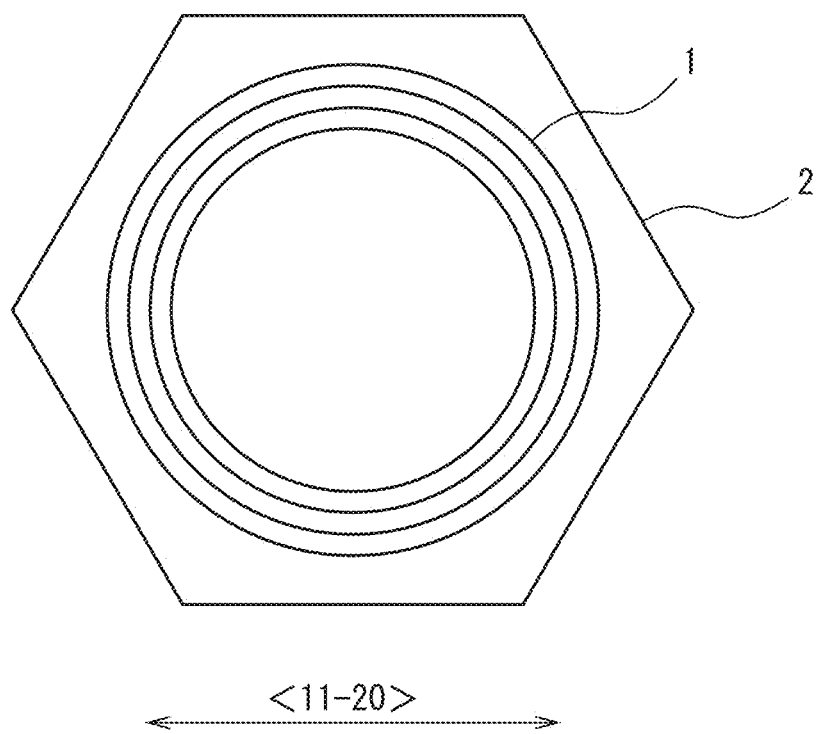
FIG. 1 is a schematic view of the step-flow growth section formed on a SiC crystal growth surface having a hexagonal shape.

For growth of a SiC single crystal by a solution process, in order to accomplish crystal growth without generation of inclusions, it is effective to carry out step-flow growth in a concentric manner at the growth surface. FIG. 1 shows a schematic view of step-flow growth sections 1 on a growth surface. As shown in FIG. 1, step-flow growth in a concentric manner on the growth surface produces stable boundaries, helping to inhibit generation of inclusions.

On the other hand, because the SiC single crystal is hexagonal, the grown crystal tends to have a hexagonal columnar shape, and as shown in FIG. 1, when growth takes place on the {0001} face, the crystal growth surface 2 tends to have a hexagonal shape.

Thus, it was found that when a SiC single crystal is grown on the {0001} face, the grown crystal readily grows to have a growth surface with a hexagonal shape, and therefore even when step-flow growth is carried out in order to inhibit inclusions, inclusions can still be generated at the gaps between the outer peripheral sections of the hexagonal growth surface and the concentric step-flow growth sections on the growth surface. It was found that inclusions tend to be generated particularly when obtaining a SiC single crystal having a large growth thickness of 2 mm or larger.

Based on this knowledge, and upon conducting much research, the present inventors discovered a SiC single crystal having a length of 2 mm or greater in the growth direction, having the {0001} face as the growth surface, and wherein the total length M of the outer peripheral section formed by the {1-100} faces on the growth surface and the length P of the outer periphery of the growth surface, satisfy the relationship M/P≤0.70.

The invention is directed to a SiC single crystal grown by a solution process, wherein the total length M of the outer peripheral section formed by the {1-100} faces on the {0001} growth surface of the SiC single crystal, and the length P of the outer periphery of the growth surface of the SiC single crystal, satisfy the relationship M/P≤0.70, and the length in the growth direction of the SiC single crystal is 2 mm or greater.

The growth surface of the SiC single crystal of the invention is the {0001} face, i.e., can be the (0001) face (also referred to as the Si-face) or the (000-1) face (also referred to as the C-face). Preferably, the growth surface of the SiC single crystal of the invention is the (000-1) face.

The growth thickness of the SiC single crystal of the invention is 2 mm or greater, preferably 3 mm or greater, more preferably 4 mm or greater, even more preferably 5 mm or greater and yet more preferably 6 mm or greater. According to the invention, it is possible to obtain a SiC single crystal that contains no inclusions across the above entire thickness range.

The diameter of the SiC single crystal of the invention is preferably 12 mm or greater, more preferably 25 mm or greater, even more preferably 45 mm or greater and yet more preferably 50 mm or greater. According to the invention, it is possible to obtain a SiC single crystal that contains no inclusions across the above entire diameter range.

A solution process is a process for producing a SiC single crystal in which a SiC seed crystal is contacted with a Si—C solution having a temperature gradient such that the temperature decreases from the interior toward the surface, to grow a SiC single crystal. By forming a temperature gradient in which the temperature decreases from the interior of the Si—C solution toward the surface of the solution, the surface region of the Si—C solution becomes supersaturated and a SiC single crystal is grown from the seed crystal substrate contacting with the Si—C solution.

Figure 2:
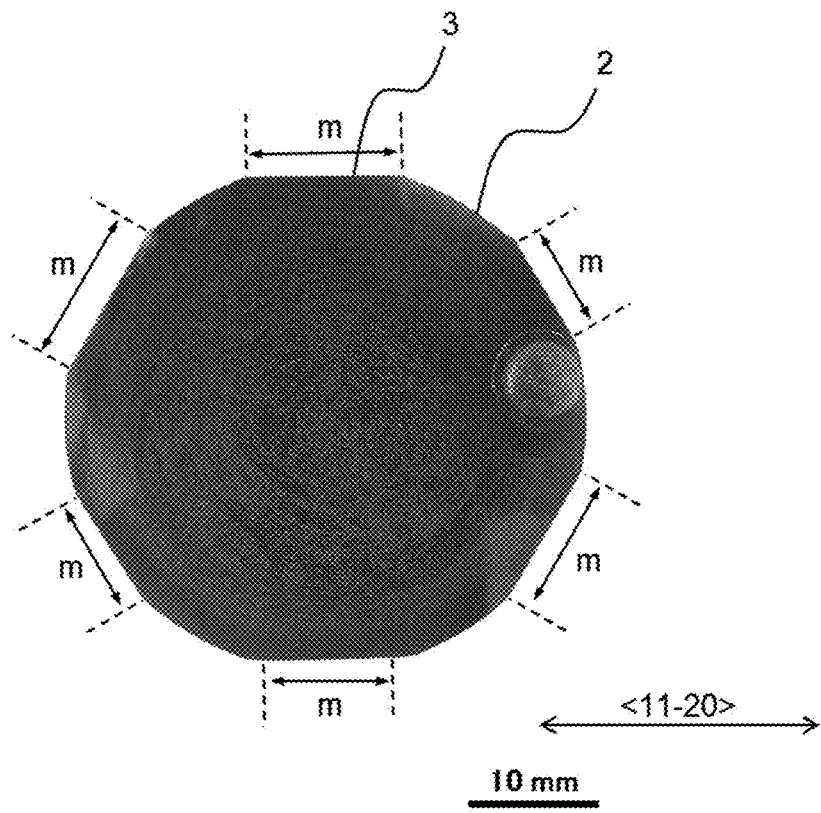
FIG. 2 is a photomicrograph of a SiC single crystal of the invention as observed from the growth surface.

FIG. 2 is a photomicrograph of a SiC single crystal of the invention as observed from the crystal growth surface 2. As shown in FIG. 2, on the {0001} growth surface of the grown crystal, the outer peripheral section 3 formed by the {1-100} faces have linear shapes, and are formed at 6 locations at approximately 60° spacings on the outer peripheral section of the growth surface. If the length of each outer peripheral section 3 formed by the {1-100} faces is denoted by "m", then the total length M of the {1-100} faces is the total of the lengths m of the linear sections formed at the 6 locations at approximately 60° spacings. On the crystal growth surface 2, the sections between the outer peripheral sections 3 formed by the {1-100} faces are curved, and therefore are clearly distinguishable from the outer peripheral sections 3 formed by the {1-100} faces which have linear shapes.

Normally, when {0001} face (c-face) growth of a SiC single crystal is conducted by a solution process, growth is rapid in the <11-20> direction while growth is slow in the <1-100> direction. Therefore, {1-100} faces (m faces) are more abundant at the sides of the grown crystal, and as shown in FIG. 1, growth tends to occur so that the crystal growth surface 2 has a hexagonal shape. When the grown crystal sides are composed entirely of {1-100} faces, the growth surface is hexagonal, and the outer peripheral sections are constituted by the sides that form the borders between the {0001} faces that are the growth surfaces of the grown crystal, and the {1-100} faces that are the sides of the grown crystal. A larger growth thickness results in more of the {1-100} faces on the sides of the grown crystal, and this tendency becomes marked in a SiC crystal having a thickness of 2 mm or greater in the growth direction.

In the SiC single crystal of the invention, the sides of the grown crystal have not only the {1-100} faces (m faces) but also {11-20} faces (a-faces), and on the growth surface, the total length M of the outer peripheral sections formed by the {1-100} faces, and the length P on the outer periphery of the growth surface, satisfy the relationship M/P≤0.70.

On the growth surface of the SiC single crystal with {0001} face growth, the shape of the growth surface approaches a circular form if the total length M of the outer peripheral section formed by the {1-100} faces with respect to the length P of the outer periphery satisfies the proportion specified above. As the shape of the growth surface approaches a circular form, the shape difference between the outer peripheral section of the growth surface and the concentric step-flow growth sections on the growth surface becomes less pronounced, and therefore a SiC single crystal can be obtained having reduced inclusions that are potentially generated between the outer peripheral section of the growth surface and the step-flow growth sections.

In the SiC single crystal of the invention, the upper limit for M/P is no greater than 0.70 and preferably no greater than 0.60. A smaller M/P value will allow the shape of the growth surface of the grown crystal to more closely approach a circular form.

In the SiC single crystal of the invention, the lower limit for the M/P is 0 or greater. In the case of a SiC single crystal grown from a discoid seed crystal substrate, the M/P value at initial growth may be a value of 0 or nearly 0, and as the growth thickness increases, the M/P value may reach 0.10 or greater, or 0.20 or greater.

The M and P lengths can be measured, for example, by using image processing software, based on a microscope image of the growth surface.

Judgment of the presence or absence of inclusions in the SiC crystal can be made based on observation using an optical microscope. For example, as shown in FIGS. 3(a) and 3(b), the grown crystal 40 may be sliced in parallel to the growth direction, to cut a grown crystal 42 with a thickness of about 1 mm, and then light may be directed from below of the cut grown crystal to observe whether or not the entire area of the grown crystal 42 is a continuous crystal based on a transmission image, to conduct examination of the presence or absence of inclusions.

When the grown crystal 40 is grown in a substantially concentrical manner, it may be further cut in half at the center section of the cut out grown crystal 42, and the presence or absence of inclusions in the half-cut grown crystal 42 may be examined by the same method. Since inclusions are generated more easily at the outer peripheral section, the outer peripheral section alone may be cut and the presence or absence of inclusions at the outer peripheral section may be examined. The grown crystal may also be sliced perpendicularly in the growth direction, and the presence or absence of inclusions in the cut grown crystal may be examined by the same method. Alternatively, the grown crystal may be cut out as described above and subjected to energy dispersive X-ray spectroscopy (EDX) or wavelength dispersive X-ray analysis (WDX) for qualitative analysis or quantitative analysis of the Si—C solution component in the cut out grown crystal, to detect inclusions.

Based on observation of the transmittance image, the SiC single crystal portion appears semi-transparent or transparent, and the sections where inclusions are present are impervious to visible light and appear black, and therefore those black sections can be detected as inclusions. According to elemental analysis by EDX or WDX, when a Si/Cr-based solvent or Si/Cr/Ni-based solvent is used as the Si—C solution, for example, it is analyzed whether solvent components other than Si and C, such as Cr or Ni, are present in the grown crystal, and the solvent components other than Si and C, such as Cr or Ni, can be detected as inclusions.

The SiC single crystal of the invention preferably has a concave crystal growth surface. When step-flow growth is carried out, as shown in FIG. 1, concentric crystal growth proceeds on the growth surface, so that crystal growth can be carried out with a concave crystal growth surface. The SiC single crystal grown in a step-flow manner has a portion of the center section substantially parallel to the onset axis plane of crystal growth, and it has a concave crystal growth surface whose inclination increases toward the outer peripheral section of the growth surface.

When the SiC single crystal of the invention has a concave crystal growth surface, the maximum angle θ of the inclination of the concave crystal growth surface with respect to the onset axis plane of crystal growth is preferably in the range of $0<\theta\leq8°$, more preferably in the range of $1\leq\theta\leq8°$, even more preferably in the range of $2\leq\theta\leq8°$ and yet more preferably in the range of $4\leq\theta\leq8°$. If the maximum angle θ of the inclination of the concave crystal growth surface is within the above range, it will be even easier to minimize generation of inclusions.

Figure 4:
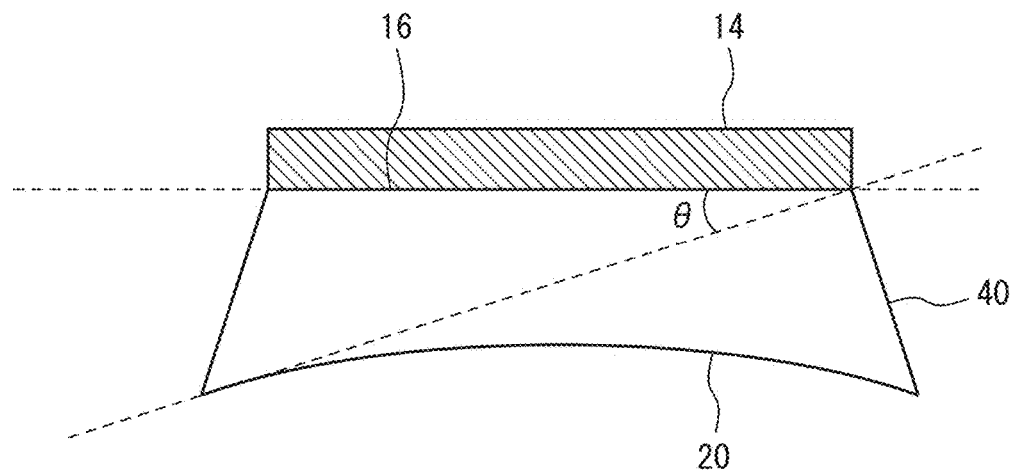
FIG. 4 is a cross-sectional schematic drawing of a SiC single crystal ingot having a concave crystal growth surface.

The maximum angle θ of the inclination can be measured by any desired method. For example, when a SiC single crystal with a concave crystal growth surface 20 is grown from a seed crystal substrate 14 having the onset axis plane 16, as shown in FIG. 4, it is possible to measure the maximum angle θ as the inclination of the tangent line on the outermost periphery of the concave crystal growth surface 20 with respect to the onset axis plane 16 of the seed crystal substrate 14.

In order to grow a SiC single crystal with a concave crystal growth surface, it is effective to increase the degree of supersaturation of the Si—C solution at the outer peripheral section directly below the interface with the crystal growth surface, so as to be greater than the degree of supersaturation of the Si—C solution at the center section directly below the interface with the crystal growth surface. This will allow the amount of crystal growth in the horizontal direction to be at a gradient so that the crystal growth surface is grown so as to be concave and the entirety of the crystal growth surface is not the onset axis plane.

If the Si—C solution is caused to flow from the center section to the outer peripheral section directly below the interface with the crystal growth surface, it is possible to minimize pooling of the Si—C solution and to stably supply solute to the entire growth interface including the outer peripheral section while supplying solute to the center section that has slower growth of the concave growth surface, and thereby a SiC single crystal having a concave growth surface containing no inclusions can be obtained.

Flow of the Si—C solution from the center section to the outer peripheral section directly below the interface with the crystal growth surface can be carried out by mechanical stirring of the Si—C solution or by electrical magnetic stirring using high-frequency heating, to cause the Si—C solution to flow from the depth of the Si—C solution toward the crystal growth surface, and to further cause the Si—C solution to flow from the center section to the outer peripheral section, forming a flow such that the Si—C solution circulates from the outer peripheral section to the depth.

The invention further relates to a method for producing a SiC single crystal in which a SiC seed crystal substrate held on a seed crystal holding shaft is contacted with a Si—C solution having a temperature gradient such that the temperature decreases from the interior toward the surface, in a crucible, to grow a SiC single crystal, wherein the method comprises growing the SiC single crystal from the {0001} face of the seed crystal substrate so that the grown SiC single crystal has a length in the growth direction of 2 mm or greater, and reducing the heat loss from the <11-20> direction to be lower than the heat loss from the <1-100> direction, and wherein the ratio S/C of the diameter S of the seed crystal substrate to the inner diameter C of the crucible satisfies the relationship 0.17<S/C<1.0.

According to the method of the invention, when the SiC single crystal is grown, lowering the heat loss from the <11-20> direction to less than the heat loss from the <1-100> direction can inhibit growth in the <11-20> direction and promote growth in the <1-100> direction.

This can cause crystal growth in such a manner that the sides have not only {11-20} faces but also {1-100} faces, allowing the shape of the growth surface to approach a circular form. As the shape of the growth surface approaches a circular form, the shape difference between the outer peripheral section of the growth surface and the concentric step-flow growth sections on the growth surface becomes less pronounced, thus making it possible to reduce inclusions that are potentially generated between the outer peripheral section of the growth surface and the step-flow growth sections.

The method for lowering heat loss from the <11-20> direction to below the heat loss from the <1-100> direction may be a method of changing the magnitudes of heat loss in the <1-100> direction and <11-20> direction by the seed crystal holding shaft of the seed crystal substrate.

The method for changing the magnitude of heat loss through the seed crystal holding shaft in the <1-100> direction and the <11-20> direction may include employing a seed crystal holding shaft having low heat retaining properties in the <1-100> direction and high heat retaining properties in the <11-20> direction.

Figure 5:
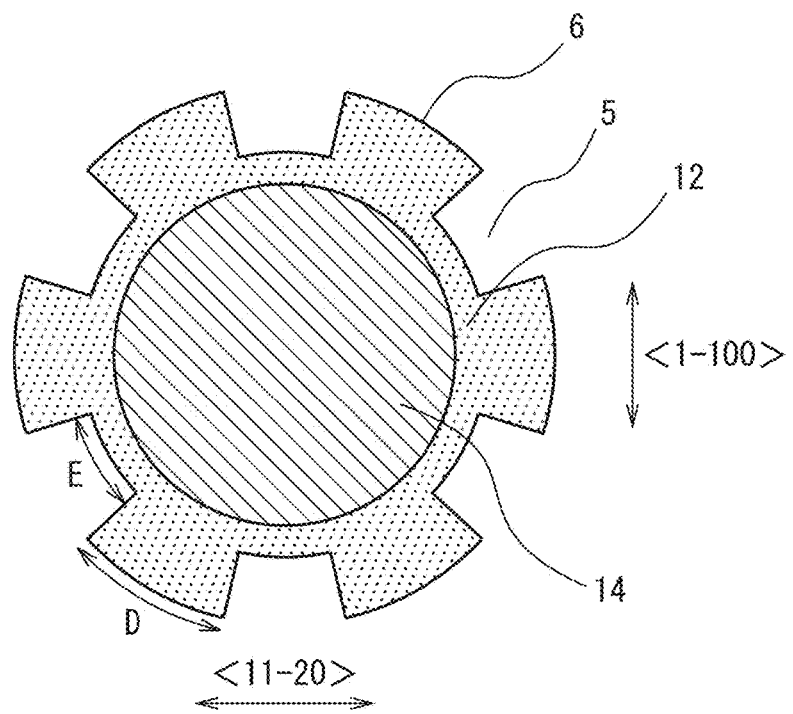
FIG. 5 is a schematic diagram of a seed crystal substrate 14 held on a cylindrical seed crystal holding shaft 12 having indented forms on the sides, as seen from the seed crystal substrate side (bottom side).

The seed crystal holding shaft having low heat retaining properties in the <1-100> direction and high heat retaining properties in the <11-20> direction may be a cylindrical seed crystal holding shaft with indented forms on the sides, as shown in FIG. 5. FIG. 5 is a schematic diagram of a seed crystal substrate 14 held on a cylindrical seed crystal holding shaft 12 having indented forms on the sides, as seen from the seed crystal substrate side (bottom side).

In the seed crystal holding shaft 12 shown in FIG. 5, the raised sections 6 have high heat retaining properties, while the recesses 5 have low heat retaining properties. The raised sections 6 have high heat retaining properties to the extent of their thickness, while the recesses 5 have low heat retaining properties to the extent of their thinness. By situating the raised sections 6 with high heat retaining properties in the <11-20> direction with a rapid growth rate and the recesses 5 with low heat retaining properties in the <1-100> direction with a slow growth rate, it is possible to reduce heat loss from the <11-20> direction to be lower than heat loss from the <1-100> direction.

For the shape of the seed crystal holding shaft 12 shown in FIG. 5, for example, the lengths of the recesses 5 in the diameter direction may have dimensions of {(seed crystal substrate diameter+(0~4)} mm, and the lengths of the raised sections 6 in the diameter direction may have dimensions of {(seed crystal substrate diameter+(4~12)} mm. The outer peripheral length D of each raised section 6 may have the dimensions {π×(raised section diameter)/12} mm, and the outer peripheral length E of each recess 5 may have the dimensions {π×(recess diameter)/12} mm.

Figure 6:
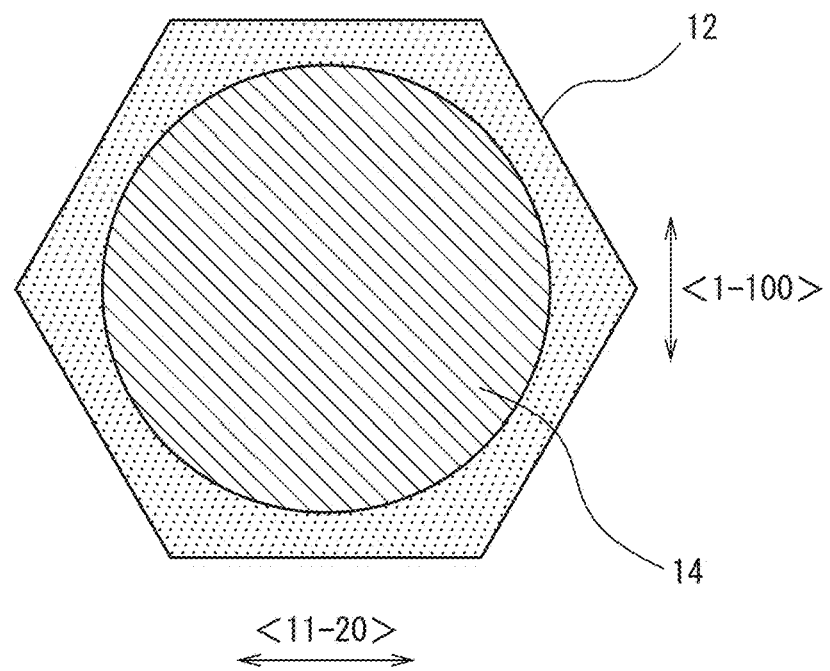
FIG. 6 is a schematic diagram of a seed crystal substrate 14 held on a seed crystal holding shaft 12 having a hexagonal cross-section, as seen from the seed crystal substrate side (bottom side).

The seed crystal holding shaft having low heat retaining properties in the <1-100> direction and high heat retaining properties in the <11-20> direction may be a seed crystal holding shaft 12 with a hexagonal shape, wherein the cross-section is larger than the growth surface of the seed crystal substrate 14, as shown in FIG. 6. FIG. 6 is a schematic diagram of a seed crystal substrate 14 held on a seed crystal holding shaft 12 having a hexagonal cross-section, as seen from the seed crystal substrate side (bottom side).

In the seed crystal holding shaft 12 shown in FIG. 6, the six angular sections have high heat retaining properties, while the six side sections have low heat retaining properties. The angular sections have heat retaining properties to the extent of their thickness, while the side sections have low heat retaining properties to the extent of their thinness. By situating the angular sections with high heat retaining properties in the <11-20> direction with a rapid growth rate and the side sections with low heat retaining properties in the <1-100> direction with a slow growth rate, it is possible to reduce heat loss from the <11-20> direction to be lower than heat loss from the <1-100> direction.

Figure 7:
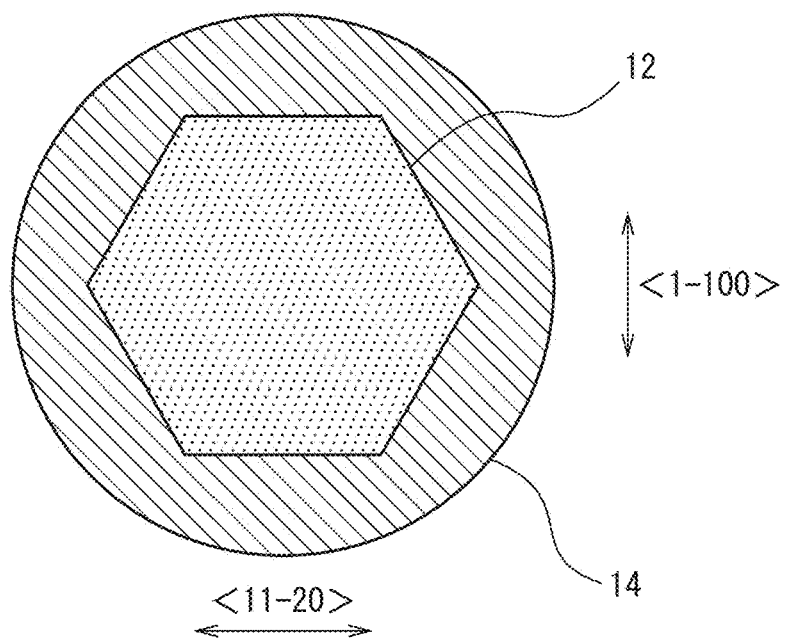
FIG. 7 is a schematic diagram of a seed crystal substrate 14 held on a seed crystal holding shaft 12 having a hexagonal cross-section, as seen from the seed crystal holding shaft side (top side).

The seed crystal holding shaft 12 shown in FIG. 6 has a cross-section that is larger than the growth surface of the seed crystal substrate 14, but alternatively, the cross-section of the seed crystal holding shaft 12 may instead be smaller than the growth surface of the seed crystal substrate 14, as shown in FIG. 7. FIG. 7 is a schematic diagram of a seed crystal substrate 14 held on a seed crystal holding shaft 12 having a hexagonal cross-section, as seen from the seed crystal holding shaft side (top side).

In the seed crystal holding shaft 12 shown in FIG. 7, the angular sections have high heat retaining properties to the extent of their thickness, while the side sections have low heat retaining properties to the extent of their thinness. Thus, even when a seed crystal holding shaft shown in FIG. 7 is used, the angular sections with high heat retaining properties may be oriented in the <11-20> direction with a rapid growth rate and the side sections with low heat retaining properties may be oriented in the <1-100> direction with a slow growth rate, to reduce heat loss from the <11-20> direction to be lower than heat loss from the <1-100> direction.

Figure 8:
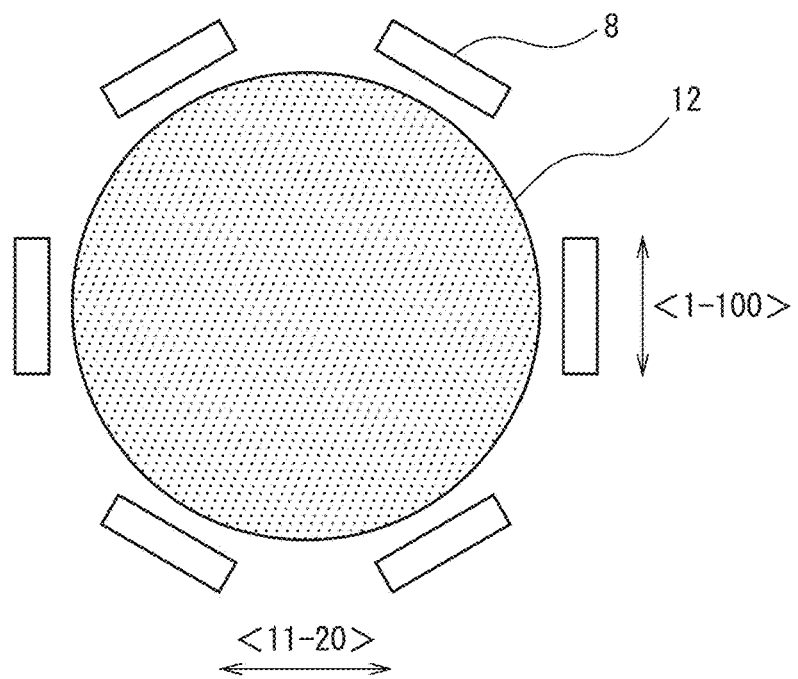
FIG. 8 is a schematic diagram of the periphery of a seed crystal holding shaft 12 holding a seed crystal substrate 14, around which there is arranged a thermal insulating material 8, as seen from the seed crystal holding shaft side (top side).

Alternatively, as shown in FIG. 8, a thermal insulating material 8 may be situated on the periphery of the seed crystal holding shaft 12. FIG. 8 is a schematic diagram of the periphery of a seed crystal holding shaft 12 holding a seed crystal substrate 14, around which there is arranged a thermal insulating material 8, as seen from the seed crystal holding shaft side (top side). By situating the thermal insulating material 8 in the <11-20> direction with a rapid growth rate and not situating the thermal insulating material 8 in the <1-100> direction with a slow growth rate, it is possible to reduce heat loss from the <11-20> direction to be lower than heat loss from the <1-100> direction.

The jig holding the thermal insulating material 8 is not shown here, but for example, the thermal insulating material 8 may be held on a ring-shaped holding fixture having a larger diameter than the cross-section of the seed crystal holding shaft 12, and suspended from the top side. The thermal insulating material 8 may be situated in contact with the seed crystal holding shaft, or the thermal insulating material 8 may be bonded to the seed crystal holding shaft. The thermal insulating material 8 may be a heat-insulating material, such as a graphite-based heat-insulating material, carbon fiber-molded heat-insulating material, or the like.

Figure 9:
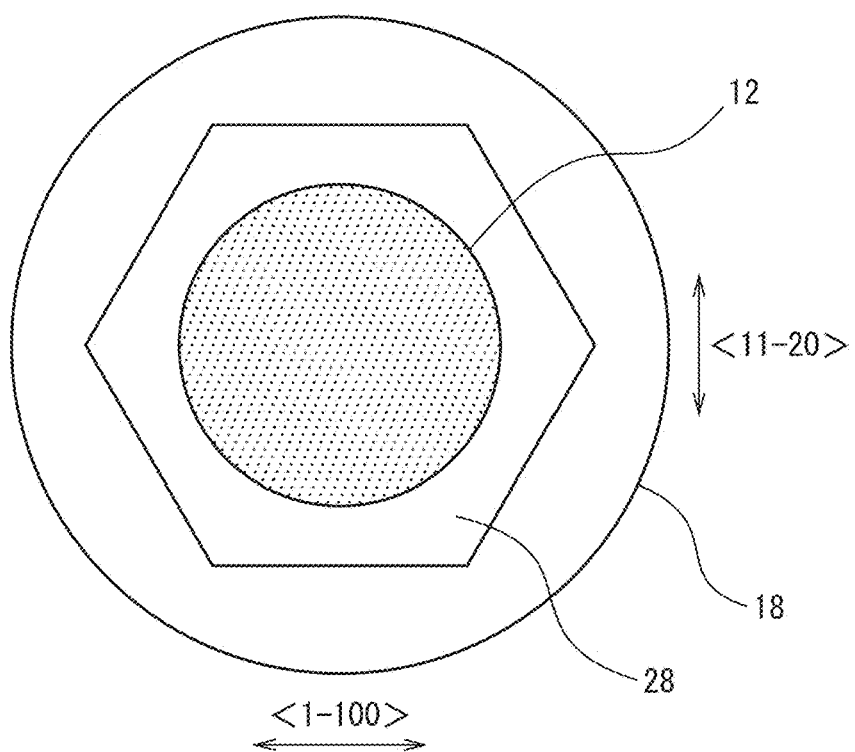
FIG. 9 is a schematic diagram showing a seed crystal holding shaft 12 passing through the hexagonal opening 28 of a cover (heat-insulating material 18) over a crucible, as seen from the seed crystal holding shaft side (top side).

As a different method for changing the magnitude of heat loss through the seed crystal holding shaft in the <1-100> direction and the <11-20> direction, there may be mentioned a hexagonal shape for the opening 28 of the cover (heat-insulating material 18) for passage of the seed crystal holding shaft 12, which is over the crucible, as shown in FIG. 9. FIG. 9 is a schematic diagram showing a seed crystal holding shaft 12 passing through the hexagonal opening 28 of a cover (heat-insulating material 18) over a crucible, as seen from the seed crystal holding shaft side (top side). When the cylindrical seed crystal holding shaft 12 is passed through the hexagonal opening 28, the angular sections of the opening 28 have lower heat retaining properties with their increased distance from the seed crystal holding shaft 12, while the side sections of the opening 28 have higher heat retaining properties with their decreased distance from the seed crystal holding shaft 12.

By situating the side sections with high heat retaining properties in the <11-20> direction with a rapid growth rate and the angular sections with low heat retaining properties in the <1-100> direction with a slow growth rate, it is possible to reduce heat loss from the <11-20> direction to be lower than heat loss from the <1-100> direction. When a SiC single crystal is grown using a cover (heat-insulating material 18) having such an opening 28 and the seed crystal holding shaft 12 is rotated, the cover (heat-insulating material 18) with the opening 28 rotates in synchronization.

In the method of the invention, a SiC single crystal having quality commonly used for production of SiC single crystals may be used as the seed crystal substrate. For example, a SiC single crystal commonly formed by a sublimation process may be used as the seed crystal substrate.

In order to create a difference between heat loss in the <1-100> direction and heat loss in the <11-20> direction of the seed crystal substrate by using a method as described above, the crystal orientation of the seed crystal substrate may be examined beforehand by using an X-ray powder diffraction (XRD) device to identify the <1-100> direction and <11-20> direction of the seed crystal substrate.

In a commercially available SiC single crystal commonly fabricated by a sublimation process, usually an orientation flat is formed so that the direction of the crystal axis direction is apparent. The orientation flat serves as a mark indicating the orientation of the crystal, and is formed as a straight linear notch. A large notch indicates the direction parallel to the <11-20> direction, while a small notch indicates the direction parallel to the <1-100> direction, such that the <1-100> direction and <11-20> direction of the seed crystal substrate can be established.

The seed crystal substrate to be used in the method of the invention preferably has a growth surface with a circular or substantially circular shape. The seed crystal substrate therefore preferably has a discoid or cylindrical shape, or similar. The seed crystal substrate may also include an orientation flat.

The {0001} face of a seed crystal substrate having such a shape may be used as the bottom face of the seed crystal contacting with the Si—C solution surface, and the top face on the opposite side may be used as the face held on the seed crystal holding shaft. The seed crystal holding shaft may be a graphite shaft, for example.

In the method of the invention, a crucible and seed crystal substrate are used such that S/C, which is the ratio of the diameter S of the seed crystal substrate with respect to the inner diameter C of the crucible, satisfies the relationship 0.17<S/C<1.0. Throughout the present specification, the inner diameter C of the crucible is the inner diameter near the liquid surface of the Si—C solution, and the diameter S of the seed crystal substrate is the minimum circular diameter surrounding the growth surface of the seed crystal substrate.

If the diameter S of the seed crystal substrate is at least a prescribed size with respect to the inner diameter C of the crucible, the {0001} growth surface of the grown crystal will be able to approach a circular form. While it is not our intention to be constrained by theory, it is possible that when the diameter S of the seed crystal substrate is at least the prescribed size with respect to the inner diameter C of the crucible, the temperature gradient in the direction parallel to the liquid surface of the Si—C solution (the horizontal direction) can be larger, and crystal growth in the horizontal direction is promoted, so that the difference in growth rates in the <11-20> direction and <1-100> direction is reduced.

The lower limit for S/C, as the ratio of the diameter S of the seed crystal substrate with respect to the inner diameter C of the crucible, is greater than 0.17, preferably 0.50 or greater and more preferably 0.64 or greater. The upper limit for S/C is less than 1.0. By using a crucible and seed crystal substrate satisfying the above ratio, the {0001} growth surface can approach a circular form.

Figure 10:
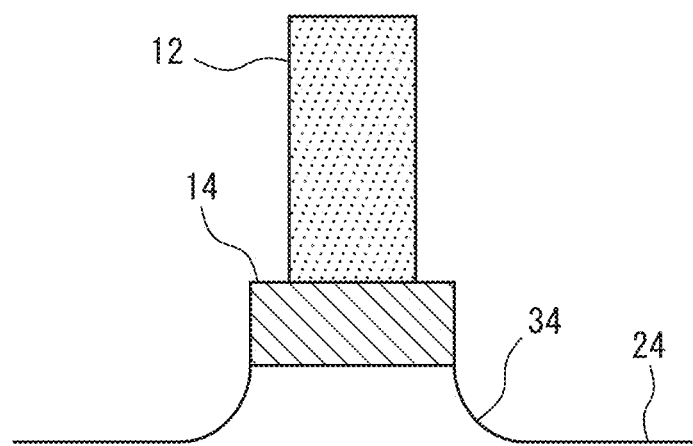
FIG. 10 is a cross-sectional schematic drawing of a meniscus formed between a seed crystal substrate and a Si—C solution.

Preferably, in the method of the invention, the Si—C solution wets only the bottom face of the seed crystal substrate, forming a meniscus for crystal growth, as shown in FIG. 10. FIG. 10 is a cross-sectional schematic drawing of the meniscus 34 formed between a seed crystal substrate 14 and a Si—C solution 24.

As used herein, "meniscus" refers to a concave curved surface formed on the surface of the Si—C solution raised by surface tension upon wetting of the seed crystal substrate, as shown in FIG. 10. By conducting crystal growth with formation of a meniscus, generation of polycrystals is minimized and it will be easier to grow a SiC single crystal composed of a single crystal with a clean outer periphery. To form a meniscus, for example, after the seed crystal substrate has been contacted with the Si—C solution, the seed crystal substrate may be raised and held at a position where the bottom face of the seed crystal substrate is higher than the liquid surface level of the Si—C solution.

Since the meniscus portion formed on the outer periphery of the growth interface is at a lower temperature due to radiation heat loss, formation of the meniscus can create a temperature gradient in which the temperature of the Si—C solution is lower at the outer periphery than at the center section directly below the interface with the crystal growth surface. This can increase the degree of supersaturation of the Si—C solution at the outer periphery of the growth interface, so that it is greater than the degree of supersaturation of the Si—C solution at the center section of the growth interface.

By increasing the degree of supersaturation of the Si—C solution at the outer periphery of the growth interface to be greater than the degree of supersaturation of the Si—C solution at the center section of the growth interface, a gradient of the degree of supersaturation is formed in the horizontal direction within the Si—C solution directly below the crystal growth interface, and a SiC crystal can be grown having a concave crystal growth surface. This allows crystal growth without the crystal growth surface of the SiC single crystal being the onset axis plane, and can further minimize generation of inclusions.

By forming a meniscus in this manner, it is possible to control the temperature of the Si—C solution so that the temperature of the Si—C solution at the outer peripheral sections directly below the interface with the crystal growth surface is lower than the temperature of the Si—C solution at the center section directly below the interface with the crystal growth surface. Similar temperature control can also be carried out by using a seed crystal holding shaft having higher thermal conductivity at the side sections than at the center sections. By using a seed crystal holding shaft wherein the thermal conductivity differs at the side sections and at the center section, it is possible to control the magnitude of heat loss through the seed crystal holding shaft in the direction of the diameter of the seed crystal holding shaft. Similar temperature control can also be carried out by blowing in gas from the outer peripheral sides of the grown crystal.

The temperature of the Si—C solution and the temperature of the grown crystal are substantially the same at the interface of crystal growth, and for this method, control of the temperature of the Si—C solution directly below the interface is substantially the same as control of the temperature on the grown crystal surface.

In the method of the invention, it is also preferred to introduce flow of the Si—C solution from the center section to the outer peripheral sections directly below the interface with the crystal growth surface. Introducing flow of the Si—C solution from the center section to the outer peripheral sections directly below the interface with the crystal growth surface prevents pooling of the Si—C solution and allows continued flow so that the solute can continue to be sufficiently and stably supplied over the entire growth interface of the crystal, and to more easily obtain a SiC single crystal containing no inclusions throughout the entire grown crystal.

Particularly for growth of a SiC single crystal having a concave crystal growth surface, if the Si—C solution is caused to flow from the center section to the outer peripheral section directly below the crystal growth interface, pooling of the Si—C solution can be minimized and it is possible to stably supply solute to the entire growth interface including the outer peripheral section while supplying solute to the center section that has slower growth of the concave crystal growth surface, and to more easily obtain a SiC single crystal having a concave crystal growth surface containing no inclusions.

In the method of the invention, therefore, preferably the temperature of the Si—C solution is controlled so that the temperature of the Si—C solution at the outer peripheral sections directly below the interface with the crystal growth surface is lower than the temperature of the Si—C solution at the center section directly below the interface with the crystal growth surface, while the Si—C solution is caused to flow from the center section to the outer peripheral sections directly below the interface with the crystal growth surface.

Flow of the Si—C solution from the center section to the outer peripheral section directly below the interface with the crystal growth surface can be carried out by causing the Si—C solution to flow from the depth of the Si—C solution toward the crystal growth surface, and further causing the Si—C solution to flow from the center section to the outer peripheral section, creating a flow such that the Si—C solution circulates from the outer peripheral section to the depth.

The method for flow of the Si—C solution from the center section to the outer peripheral sections directly below the interface with the crystal growth surface may be mechanical stirring of the Si—C solution, electrical magnetic stirring by high-frequency heating, or the like. A preferred method for introducing flow of the Si—C solution from the center section to the outer peripheral sections directly below the interface with the crystal growth surface is a method in which the seed crystal substrate is rotated at a prescribed speed for at least a prescribed time period, continuously in a constant direction.

By rotating the seed crystal substrate continuously in a fixed direction at a fixed speed for at least a prescribed period of time, it is possible to promote flow of the Si—C solution directly below the crystal growth interface, and in particular to eliminate stagnated flow sections of the Si—C solution at the outer peripheral sections and minimize incorporation of inclusions at the outer peripheral sections.

Throughout the present specification, the rotational speed of the seed crystal substrate is the speed at the outermost periphery of the growth surface (bottom face) of the seed crystal substrate (also referred to herein as the outer peripheral section or outermost periphery of the seed crystal substrate). The speed at the outer peripheral section of the seed crystal substrate is preferably a speed that is greater than 25 mm/sec, more preferably at least 45 mm/sec and even more preferably at least 63 mm/sec. Limiting the speed at the outer peripheral section of the seed crystal substrate to within the above range will make it even easier to minimize inclusions.

The grown crystal will usually grow to have the same diameter or an enlarged diameter with respect to the growth surface of the seed crystal substrate, and therefore the rotational speed at the outer peripheral section of the grown crystal will be the same as or greater than the speed at the outer peripheral section of the seed crystal substrate. Thus, controlling the speed at the outer peripheral section of the seed crystal substrate to within the aforementioned range allows flow of the Si—C solution to continue directly below the grown crystal even when crystal growth has proceeded.

The speed at the outer peripheral section of the grown crystal may also be controlled to within the aforementioned speed range, instead of controlling the speed at the outer peripheral section of the seed crystal substrate. As growth of the SiC single crystal proceeds, the grown crystal generally grows in a manner such that its diameter is the same or an enlarged diameter with respect to the growth surface of the seed crystal substrate, resulting in an increasing speed at the outer peripheral section of the grown crystal. In this case, the rotational speed per minute (rpm) may be maintained, or the rotational speed per minute (rpm) may be reduced so that the speed at the outer peripheral section of the grown crystal is constant.

When the seed crystal substrate is rotated so that flow of the Si—C solution is promoted as described above, it is not necessary to rotate the crucible. Nevertheless, this does not exclude an embodiment of rotating the crucible, and the crucible may be rotated together with the seed crystal substrate in a range in which the aforementioned rotational speed at the outer peripheral section of the seed crystal substrate is obtained relative to the Si—C solution flowed by rotation of the crucible.

When the rotational direction of the seed crystal substrate is periodically switched, setting the time of rotation (the rotation holding time) of the seed crystal substrate in the same direction to be longer than a prescribed time period can stabilize the solution flow and further minimize generation of inclusions at the outer peripheral sections.

Periodically changing the rotational direction of the seed crystal substrate facilitates growth of a concentric SiC single crystal, and can minimize generation of defects that may be generated in the grown crystal. When the rotational direction of the seed crystal substrate is periodically changed, it is possible to stabilize flow of the Si—C solution directly below the crystal growth interface by keeping rotation in the same direction for a prescribed period of time or longer. If the rotation holding time is too short, switching of the rotational direction will become too frequent, and this may render flow of the Si—C solution insufficient or unstable.

When the rotational direction of the seed crystal substrate is to be periodically changed, the rotation holding time in the same direction is preferably longer than 30 seconds, more preferably 200 seconds or longer and even more preferably 360 seconds or longer. Limiting the rotation holding time in the same direction of the seed crystal substrate to within the above range will make it even easier to minimize inclusions.

When the rotational direction of the seed crystal substrate is periodically changed, a shorter time for the stopping time of the seed crystal substrate during switching of the rotational direction in the reverse direction is desired, and it is preferably no greater than 10 seconds, more preferably no greater than 5 seconds, even more preferably no greater than 1 second and yet more preferably substantially 0 seconds.

The seed crystal substrate that can be used in the method may be, for example, a SiC single crystal that has been normally grown by a sublimation process, but it is preferred to use a SiC single crystal having a flat growth surface and having the (0001) onset axis plane or (000-1) onset axis plane, or a SiC single crystal having a concave growth surface and having a (0001) face or (000-1) face at a section near the center section of the concave growth surface.

Placement of the seed crystal substrate in the single crystal production apparatus may be done by holding the top face of the seed crystal substrate on the seed crystal holding shaft as described above. A carbon adhesive may be used for holding of the seed crystal substrate on the seed crystal holding shaft.

Contact of the seed crystal substrate with the Si—C solution may be carried out by lowering the seed crystal holding shaft holding the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

The holding position for the seed crystal substrate may be such that the position of the bottom face of the seed crystal substrate may match the Si—C solution surface or be below the Si—C solution surface, or be above the Si—C solution surface. The position of the bottom face of the seed crystal substrate is preferably above the Si—C solution surface, so that a meniscus is formed. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position.

The position of the bottom face of the seed crystal substrate may match the Si—C solution surface or be lower than the Si—C solution surface, but in order to prevent generation of polycrystals, it is preferably such that the Si—C solution does not contact with the seed crystal holding shaft. In such methods, the position of the seed crystal substrate may be adjusted during growth of the single crystal.

In the method of the invention, a Si—C solution is a solution in which C is dissolved, where the solvent is a molten liquid of Si or Si/X (X being one or more metals other than Si). X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A preferred Si—C solution is one wherein the solvent is a molten liquid with an atomic composition percentage of Si/Cr/X=30-80/20-60/0-10, since it has low variation in C dissolution. For example, Cr, Ni and the like may be loaded into the crucible in addition to Si, to form a Si—Cr solution, Si—Cr—Ni solution or the like.

For the method of the invention, the temperature of the Si—C solution is the surface temperature of the Si—C solution. The lower limit for the temperature of the surface of the Si—C solution is preferably 1800° C. or higher and the upper limit is preferably 2200° C., since the C dissolution in the Si—C solution can be increased within the above temperature range. When a n-type SiC single crystal is to be grown, the lower limit for the temperature of the surface of the Si—C solution is preferably 2000° C. or higher from the viewpoint of allowing the amount of nitrogen dissolution in the Si—C solution to be increased.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 11:
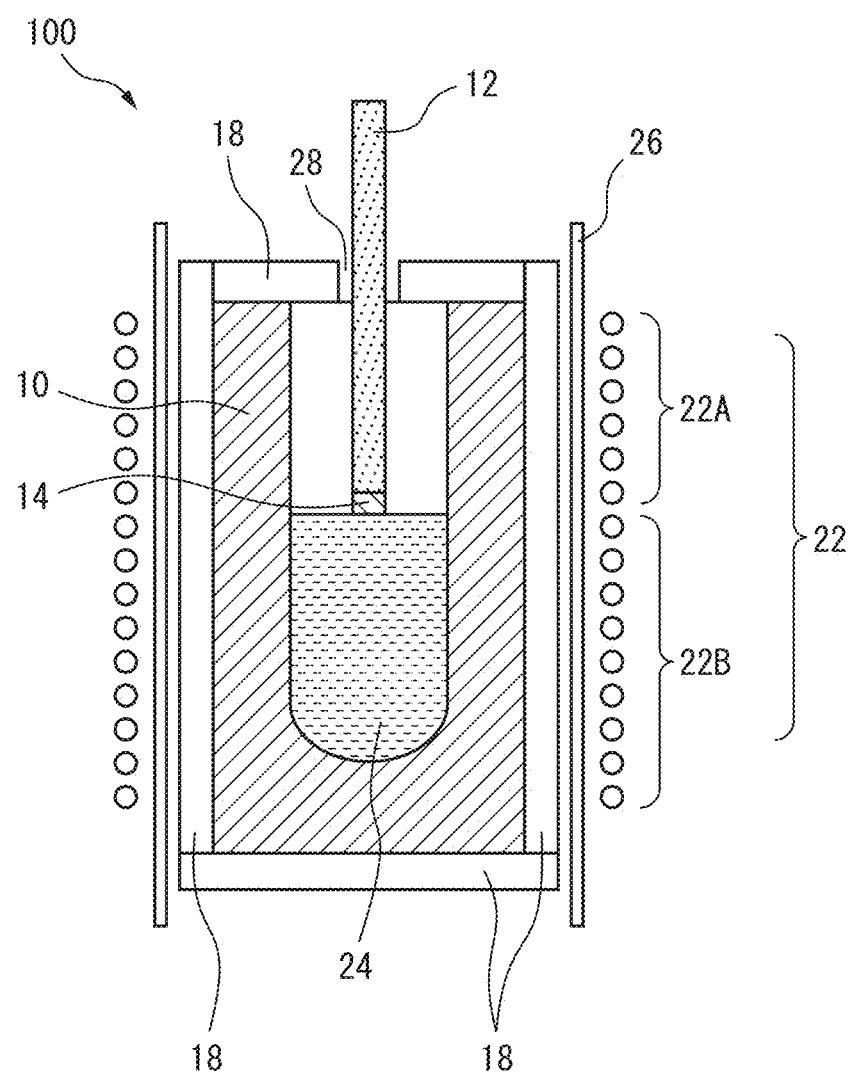
FIG. 11 is a cross-sectional schematic drawing representing an example of a single crystal production apparatus based on a solution process, to be used for the invention.

FIG. 11 shows an example of a SiC single crystal production apparatus for carrying out the invention. The illustrated SiC single crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The crucible 10 comprises an opening 28 at the top through which the seed crystal holding shaft 12 passes. By adjusting the gap (spacing) between the crucible 10 and the seed crystal holding shaft 12 at the opening 28, it is possible to vary the amount of radiation heat loss from the surface of the Si—C solution 24. Although it is usually necessary to keep the interior of the crucible 10 at high temperature, setting a large gap between the crucible 10 and the seed crystal holding shaft 12 at the opening 28 can increase radiation heat loss from the surface of the Si—C solution 24, while setting a small gap between the crucible 10 and the seed crystal holding shaft 12 at the opening 28 can reduce radiation heat loss from the surface of the Si—C solution 24. The gap (spacing) between the crucible 10 and the seed crystal holding shaft 12 at the opening 28 is preferably about 2 to 8 mm on one side, and more preferably about 4 to 6 mm on one side. When a meniscus has formed, radiation heat loss can take place from the meniscus portion as well.

The temperature of the Si—C solution will usually have a temperature distribution with a lower temperature at the surface than the interior of the Si—C solution due to radiation and the like. Further, by adjusting the number of turns and spacing of the high-frequency coil 22, the positional relationship of the high-frequency coil 22 and the crucible 10 in the height direction, and the output of the high-frequency coil, it is possible to form a temperature gradient in the Si—C solution 24 in the direction perpendicular to the surface of the Si—C solution 14 so that the upper portion of the solution contacting the seed crystal substrate 24 is at low temperature and the lower portion (interior) of the solution is at high temperature. For example, the output of the upper level coil 22A may be smaller than the output of the lower level coil 22B, to form a temperature gradient in the Si—C solution 24 in which the upper portion of the solution is at low temperature and the lower portion of the solution is at high temperature. For example, the temperature gradient is preferably 10 to 50° C./cm, in a range of a depth of up to about 3 cm or about 1 cm from the solution surface.

Throughout the present specification, the temperature gradient in the surface region of the Si—C solution is the temperature gradient in the direction perpendicular to the surface of the Si—C solution, which is a temperature gradient where the temperature falls from the interior of the Si—C solution toward the surface of the solution. The temperature gradient can be calculated as the average value obtained by pre-measuring the temperature A on the surface of the Si—C solution which is the low-temperature side, and the temperature B which is the high-temperature side at a prescribed depth from the surface of the Si—C solution to the solution side in the direction perpendicular to the surface of the Si—C solution, by using a thermocouple before contacting the seed crystal substrate with the Si—C solution, and dividing the temperature difference by the distance between the positions at which temperature A and temperature B were measured. For example, when measuring the temperature gradient between the surface of the Si—C solution and the position at depth D cm from the surface of the Si—C solution to the solution side in the direction perpendicular to the surface of the Si—C solution, the temperature gradient can be calculated by the following formula:

Temperature gradient($°$ C./cm)=$(B-A)/D$ wherein the temperature gradient is the difference between the surface temperature A of the Si—C solution and the temperature B at a position at depth D cm from the surface of the Si—C solution to the solution side in the direction perpendicular to the surface of the Si—C solution, divided by D cm.

The range in which the temperature gradient is controlled is preferably to a depth of 1 cm and more preferably 3 cm from the surface of the Si—C solution. When the temperature gradient is to be controlled up to a depth of 3 cm from the surface of the Si—C solution, the temperature gradient ($°$ C./cm) in the formula is the value obtained when the difference between the surface temperature A of the Si—C solution and the temperature B at a position at a depth of 3 cm from the surface of the Si—C solution in the direction perpendicular to the solution side, is divided by 3 cm.

When the range of control of the temperature gradient is too shallow, the range in which the temperature gradient is controlled will be shallow and the range in which the degree of supersaturation of C is controlled will also be shallow, sometimes causing growth of the SiC single crystal to be unstable. If the range of control of the temperature gradient is too deep, the range in which the degree of supersaturation of C is controlled will also be deep, which is effective for stable growth of the SiC single crystal, but in actuality the depth contributing to single crystal growth is very close to the surface of the Si—C solution and it is sufficient to control the temperature gradient up to a depth of several mm from the surface. Consequently, in order to conduct stable SiC single crystal growth and temperature gradient control, it is preferred to control the temperature gradient within the depth range specified above.

The C that has dissolved in the Si—C solution 24 is dispersed by diffusion and convection. In the region near the bottom face of the seed crystal substrate 14, a temperature gradient is formed so that it is at lower temperature than the interior of the Si—C solution 24, due to control of output from the heating apparatus, heat radiation from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC crystal is grown on the seed crystal substrate 14 by virtue of supersaturation as a driving force.

In some embodiments, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of seed crystal substrate, it is preferably about 5 to 50 μm for sufficient removal of an affected layer and a natural oxide film.

The meltback may be carried out by forming in the Si—C solution a temperature gradient in which the temperature increases from the interior of the Si—C solution toward the surface of the solution, i.e. by forming a temperature gradient in a direction opposite to the case of the SiC single crystal growth. The temperature gradient in the opposite direction can be formed by controlling the output of the high-frequency coil.

The meltback can also be carried out without forming a temperature gradient in the Si—C solution, by simply immersing the seed crystal substrate in the Si—C solution that has been heated to a temperature higher than the liquidus temperature. In this case, the dissolution rate increases with higher Si—C solution temperature, but control of the amount of dissolution becomes difficult. while a low temperature may slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

EXAMPLES (Common Conditions)

The conditions common to the examples and comparative examples will now be described. For each example, a single crystal production apparatus 100 as shown in FIG. 11 was used. In a graphite crucible 10 with an inner diameter of 70 mm and a height of 125 mm containing a Si—C solution 24 there were charged Si/Cr/Ni in an atomic compositional ratio of 55:40:5, as a molten liquid starting material. The air in the single crystal production apparatus was exchanged with argon. A high-frequency coil 22 situated around the periphery of the graphite crucible 10 was electrified to melt the starting material in the graphite crucible 10 by heating, thereby forming a Si/Cr/Ni alloy molten liquid. A sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10, forming a temperature gradient in which the temperature decreased from the interior of the Si—C solution 24 toward the surface of the solution. Formation of the prescribed temperature gradient was confirmed by using a vertically movable thermocouple to measure the temperature of the Si—C solution 24. Output of the high-frequency coils 22A and 22B was controlled to adjust the temperature to 2000° C. on the surface of the Si—C solution 24. With the surface of the Si—C solution as the low-temperature side, the temperature difference between the temperature at the surface of the Si—C solution and the temperature at a depth of 1 cm in the vertical direction from the surface of the Si—C solution 24 toward the interior of the solution was 25° C.

Example 1

A graphite seed crystal holding shaft 12 having a length of 200 mm and a shape shown in FIG. 5 was prepared. The seed crystal holding shaft 12 had six concavoconvex sections on the cylindrical side as shown in FIG. 5. The diameters of the recesses 5 were 47 mm, the diameters of the raised sections 6 were 53 mm, and the outer periphery width D formed by each of the raised sections 6 was 13.9 mm.

There was prepared a substantially discoid 4H—SiC single crystal formed by a sublimation process, with a thickness of 0.7 mm, a diameter of 45 mm, an orientation flat formed therein, and (000-1) face as the onset axis plane, for use as a seed crystal substrate 14. The ratio K of the seed crystal substrate 14 diameter/graphite crucible 10 inner diameter was 0.64.

The top face of the seed crystal substrate 14 was bonded to about the center section of the end face of the seed crystal holding shaft 12 using a graphite adhesive, with the bottom face of the seed crystal substrate 14 as the (000-1) face. The seed crystal substrate 14 was bonded to the seed crystal holding shaft 12 so that the <1-100> direction of the seed crystal substrate 14 was oriented to the recesses 5 of the seed crystal holding shaft 12 and the <11-20> direction of the seed crystal substrate 14 was oriented to the raised sections 6 of the seed crystal holding shaft 12.

The seed crystal holding shaft 12 and seed crystal substrate 14 were situated so that the seed crystal holding shaft 12 passed through a circular opening 28 with a diameter of 55 mm, opened at the top of the crucible 10. The gap between the crucible 10 and the seed crystal holding shaft 12 at the opening 28 was 5.0 mm on the side.

Next, the seed crystal holding shaft 12 holding the seed crystal substrate 14 was lowered, the seed crystal substrate 14 was contacted with the Si—C solution 24 so that the bottom face of the seed crystal substrate 14 matched the surface location of the Si—C solution 24, and only the bottom face of the seed crystal substrate 14 was wetted with the Si—C solution 24. The seed crystal substrate 14 was then raised so that the bottom face of the seed crystal substrate 14 was positioned 1.5 mm above the liquid level surface of the Si—C solution 24, forming a meniscus of the Si—C solution as shown in FIG. 10, and it was held for 10 hours to grow a SiC crystal.

During the crystal growth, the seed crystal holding shaft 12 was rotated at a speed of 70 rpm so that the outer peripheral section of the bottom face of the seed crystal substrate 14 rotated at a speed of 165 mm/sec, and the rotational direction was periodically switched so that the rotation holding time during which the seed crystal substrate 14 was continuously rotated in the same direction is 3600 seconds and the stopping time for the seed crystal substrate 14 during switching of the rotational direction is 5 seconds.

Figure 12:
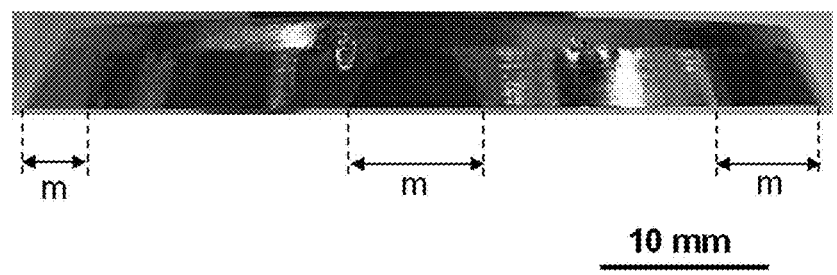
FIG. 12 is an external photograph of a SiC single crystal grown from a seed crystal substrate 14 in an example, as viewed from the side.

FIG. 12 is an external photograph of a SiC single crystal grown from the seed crystal substrate 14, as viewed from the side. FIG. 2 shows an external photograph of the grown SiC single crystal observed from the growth surface. The total length M, of the lengths m of the six {1-100} faces on the (000-1) growth surface of the grown SiC single crystal, was 78.3 mm, and the length P of the outer periphery of the growth surface was 147.7 mm, and the M/P ratio of 0.53.

Figure 3:
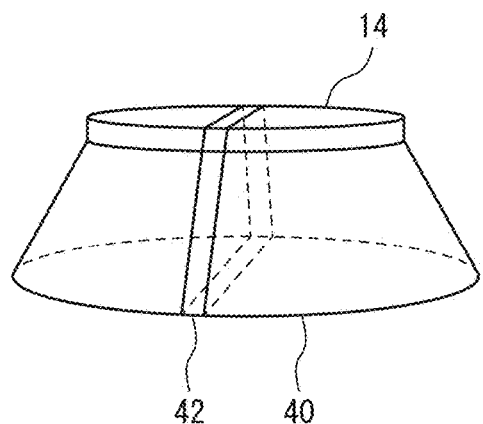
FIG. 3 is a pair of schematic diagrams showing the locations where a grown crystal is cut when examining the presence of inclusions in the grown crystal.
Figure 3:
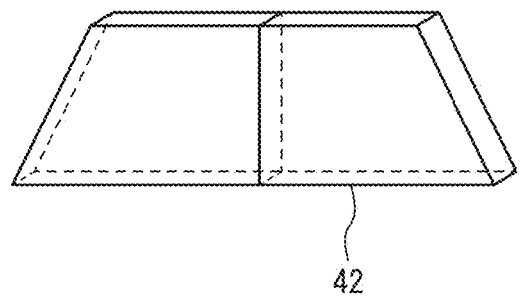
Figure 13:
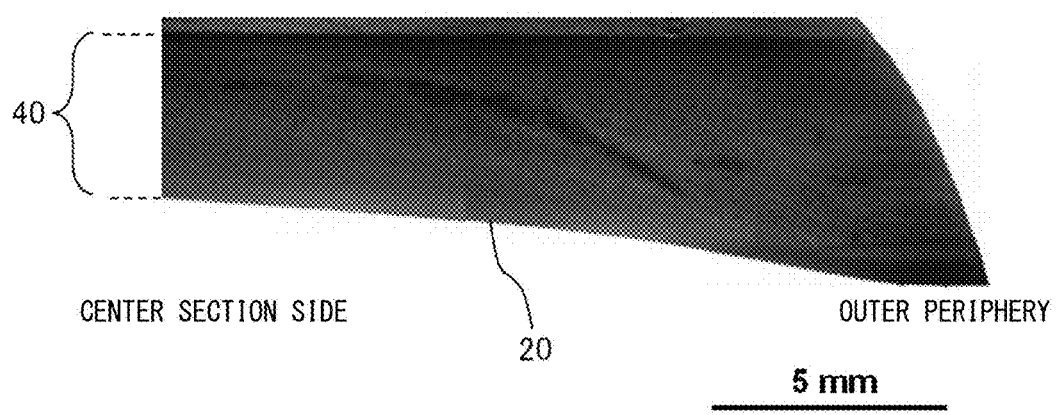
FIG. 13 is an optical microscope photograph of the cross-section of a grown crystal obtained in an example.

As shown in FIG. 3, the obtained SiC single crystal was cut in the direction horizontal to the growth direction to a thickness of 1 mm together with the seed crystal substrate 14 so that the cut grown crystal comprises the center section of the growth surface, further cut at the outer peripheral sections, and subjected to mirror polishing. The cross-section of the cut grown crystal was observed under an optical microscope in transparent mode. FIG. 13 shows an optical microscope photograph of the cross-section of the obtained grown crystal.

The obtained SiC single crystal had a concave crystal growth surface 20 with a thicker grown film thickness at the outer peripheral section of the grown crystal than at the center section. There were no visible black sections and no inclusions were present, throughout the entire grown crystal.

The maximum angle θ of the inclination of the concave crystal growth surface of the obtained grown crystal with respect to the (000-1) onset axis plane was 7.0°, the thickness of crystal growth at the concave center section was 3.3 mm, and the diameter of the growth surface of the grown crystal was 45 mm. The diameter of the growth surface of the grown crystal in each of the examples and comparative examples was the diameter of the maximum inscribed circle projected onto the (000-1) onset axis plane, and this applies to all of the diameters mentioned below.

Example 2

Crystal growth was conducted under the same conditions as Example 1, except that a seed crystal substrate 14 with a diameter of 50 mm was used, the ratio K of seed crystal substrate 14 diameter/graphite crucible 10 inner diameter was 0.71, the seed crystal holding shaft 12 used had recess diameters of 52 mm, raised section diameters of 58 mm, a width of 15.2 mm for the outer periphery width formed by the raised sections, and concavoconvex sections on the cylindrical sides, the seed crystal holding shaft 12 and the seed crystal substrate 14 were situated with the seed crystal holding shaft 12 passing through a circular opening 28 with a diameter of 60 mm, and the seed crystal holding shaft 12 was rotated at a speed of 70 rpm so that the outer peripheral section of the bottom face of the seed crystal substrate 14 rotated at a speed of 183 mm/sec.

The total length M, of the lengths m of the six {1-100} faces on the (000-1) growth surface of the grown SiC single crystal, was 72.0 mm, the length P of the outer periphery of the growth surface was 172.8 mm, and the M/P ratio was 0.42.

In the same manner as Example 1, a cross-section of the grown crystal was cut out together with the seed crystal substrate and subjected to mirror polishing, and the cross-section of the grown crystal was observed under an optical microscope in transparent mode.

The obtained SiC single crystal had a concave crystal growth surface with a thicker grown film thickness at the outer peripheral section of the grown crystal than at the center section. There were no visible black sections and no inclusions were present, throughout the entire grown crystal.

The maximum angle θ of the inclination of the concave crystal growth surface of the obtained grown crystal with respect to the (000-1) onset axis plane was 7.8°, the thickness of crystal growth at the concave center section was 2.1 mm, and the diameter of the growth surface of the grown crystal was 54 mm.

Examples 3 to 9

Crystal growth was conducted under the same conditions as Example 1, except that the seed crystal substrate 14, crucible 10, ratio K of seed crystal substrate 14 diameter/graphite crucible 10 inner diameter, and crystal growth holding time listed in Table 1, were used, and the seed crystal holding shaft 12 was rotated at a speed of 70 rpm so that the outer peripheral section of the bottom face of the seed crystal substrate 14 rotated at a speed of 165 mm/sec for Examples 3 and 5 to 9, and so that the outer peripheral section of the bottom face of the seed crystal substrate 14 rotated at a speed of 139 mm/sec for Example 4, to grow a SiC crystal.

[Table 1]

TABLE 1

Crystal growth conditions for Examples 3 to 9

| | Seed crystal substrate diameter (mm) | Crucible inner diameter (mm) | Ratio K | Crystal growth holding time (h) |
|---|---|---|---|---|
| Example 3 | 45 | 70 | 0.64 | 12 |
| Example 4 | 38 | 70 | 0.54 | 12 |
| Example 5 | 45 | 70 | 0.64 | 12 |
| Example 6 | 45 | 70 | 0.64 | 13 |
| Example 7 | 45 | 70 | 0.64 | 24 |
| Example 8 | 45 | 70 | 0.64 | 24 |
| Example 9 | 45 | 70 | 0.64 | 30 |

The SiC single crystals grown in Examples 3 to 9 had a concave crystal growth surface with a thicker grown film thickness at the outer peripheral section of the grown crystal than at the center section. Table 2 shows the ratios M/P for the total length M of the {1-100} face with respect to the length P of the outer periphery of the growth surface, the crystal growth thicknesses at the center sections of the concave grown crystal surfaces, the growth surface diameters, the maximum angles of the growth surface inclination, and the presence or absence of inclusions, for the (000-1) growth surfaces of the SiC single crystals grown in Examples 3 to 9.

[Table 2]

TABLE 2

Properties of SiC single crystals grown in Examples 3 to 9

| | M/P | Growth thickness (mm) | Growth surface diameter (mm) | Maximum angle of inclination (deg) | Inclusions |
|---|---|---|---|---|---|
| Example 3 | 0.24 | 2.0 | 50 | 6.8 | Absent |
| Example 4 | 0.46 | 3.0 | 52 | 7.2 | Absent |
| Example 5 | 0.53 | 3.2 | 52 | 6.2 | Absent |
| Example 6 | 0.55 | 3.8 | 55 | 5.4 | Absent |
| Example 7 | 0.60 | 5.1 | 60 | 5.9 | Absent |
| Example 8 | 0.57 | 5.2 | 60 | 6.7 | Absent |
| Example 9 | 0.49 | 6.1 | 61 | 7.8 | Absent |

Comparative Example 1

Crystal growth was conducted under the same conditions as Example 1, except that a seed crystal substrate 14 with a diameter of 12 mm was used, the ratio K of seed crystal substrate 14 diameter/graphite crucible 10 inner diameter was 0.17, the seed crystal holding shaft 12 used had recess diameters of 14 mm, raised section diameters of 20 mm, a width of 5.2 mm for the outer periphery width formed by the raised sections, and concavoconvex sections on the cylindrical sides, the seed crystal holding shaft 12 and the seed crystal substrate 14 were situated with the seed crystal holding shaft 12 passing through a circular opening 28 with a diameter of 22 mm, and the seed crystal holding shaft 12 was rotated at a speed of 70 rpm so that the outer peripheral section of the bottom face of the seed crystal substrate 14 rotated at a speed of 44 mm/sec, with holding for 24 hours to grow a SiC crystal.

The total length M, of the lengths m of the six {1-100} faces on the (000-1) growth surface of the grown SiC single crystal, was 45 mm, the length P of the outer periphery of the growth surface was 45 mm, and the M/P ratio of 1.00.

In the same manner as Example 1, a cross-section of the grown crystal was cut out together with the seed crystal substrate and subjected to mirror polishing, and the cross-section of the grown crystal was observed under an optical microscope in transparent mode.

The obtained SiC single crystal had a concave crystal growth surface with a thicker grown film thickness at the outer peripheral section of the grown crystal than at the center section. Inclusions were present in portions of the outer peripheral sections of the grown crystal.

The maximum angle θ of the inclination of the concave crystal growth surface of the obtained grown crystal with respect to the (000-1) onset axis plane was 6.6°, the thickness of crystal growth at the concave center section was 6.9 mm, and the shape was hexagonal with sides of 7.51 mm.

Comparative Example 2

Crystal growth was conducted under the same conditions as Example 1, except that a seed crystal substrate 14 with a diameter of 25 mm was used, the ratio K of seed crystal substrate 14 diameter/graphite crucible 10 inner diameter was 0.36, the seed crystal holding shaft 12 used had recess diameters of 27 mm, raised section diameters of 33 mm, a width of 8.6 mm for the outer periphery width formed by the raised sections, and concavoconvex sections on the cylindrical sides, the seed crystal holding shaft 12 and the seed crystal substrate 14 were situated with the seed crystal holding shaft 12 passing through a circular opening 28 with a diameter of 35 mm, and the seed crystal holding shaft 12 was rotated at a speed of 70 rpm so that the outer peripheral section of the bottom face of the seed crystal substrate 14 rotated at a speed of 92 mm/sec, with holding for 7 hours to grow a SiC crystal.

Figure 14:
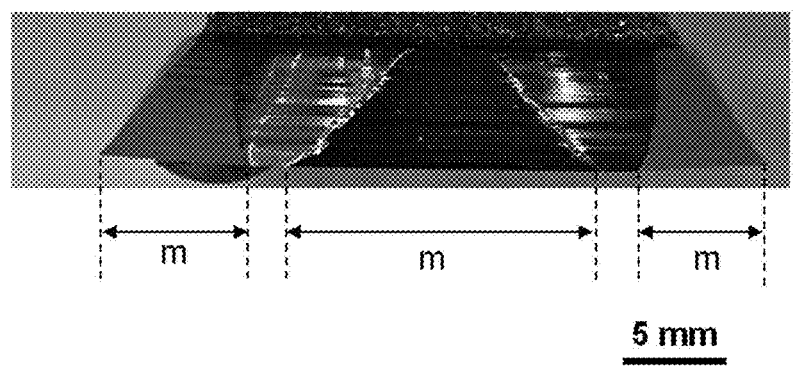
FIG. 14 is an external photograph of a SiC single crystal grown from a seed crystal substrate 14 in a comparative example, as viewed from the side.

FIG. 14 is an external photograph of the SiC single crystal grown in Comparative Example 2, as observed from the side face. The total length M, of the lengths m of the six {1-100} faces on the (000-1) growth surface of the grown SiC single crystal, was 81 mm, the length P of the outer periphery of the growth surface was 91 mm, and the M/P ratio of 0.89.

The obtained SiC single crystal had a concave crystal growth surface with a thicker grown film thickness at the outer peripheral section of the grown crystal than at the center section. Inclusions were present in portions of the outer peripheral sections of the grown crystal.

The maximum angle θ of the inclination of the concave crystal growth surface of the obtained grown crystal with respect to the (000-1) onset axis plane was 4.9°, the thickness of crystal growth at the concave center section was 2.7 mm, and the diameter of the growth surface of the grown crystal was 28 mm.

Comparative Example 3

Crystal growth was conducted under the same conditions as Example 1, except that a seed crystal substrate 14 with a diameter of 50 mm was used, the ratio K of seed crystal substrate 14 diameter/graphite crucible 10 inner diameter was 0.71, the seed crystal holding shaft 12 used was cylindrical with a diameter of 50 mm and no concavoconvexities, the seed crystal holding shaft 12 and the seed crystal substrate 14 were situated with the seed crystal holding shaft 12 passing through a circular opening 28 with a diameter of 60 mm, and the seed crystal holding shaft 12 was rotated at a speed of 70 rpm so that the outer peripheral section of the bottom face of the seed crystal substrate 14 rotated at a speed of 183 mm/sec, with holding for 15 hours to grow a SiC crystal.

The total length M, of the lengths m of the six {1-100} faces on the (000-1) growth surface of the grown SiC single crystal, was 157 mm, the length P of the outer periphery of the growth surface was 173 mm, and the M/P ratio was 0.91.

The obtained SiC single crystal had a concave crystal growth surface with a thicker grown film thickness at the outer peripheral section of the grown crystal than at the center section. Inclusions were present in substantially all of the outer peripheral sections of the grown crystal.

The maximum angle θ of the inclination of the concave crystal growth surface of the obtained grown crystal with respect to the (000-1) onset axis plane was 6.0°, the thickness of crystal growth at the concave center section was 4.0 mm, and the diameter of the growth surface of the grown crystal was 55 mm.

Comparative Examples 4 to 7

Crystal growth was conducted under the same conditions as Example 1, except that the seed crystal substrate 14 and crucible 10 having diameters, the ratios K of seed crystal substrate 14 diameter/graphite crucible 10 inner diameter, and the crystal growth holding times shown in Table 3, were used, the seed crystal holding shaft 12 used was cylindrical having the same diameter as the seed crystal substrate 14 and having no concavoconvexities on the side face, the seed crystal holding shaft 12 and seed crystal substrate 14 were situated with the seed crystal holding shaft 12 passing through a circular opening 28 having an orifice of 10 mm larger than the diameter of the seed crystal holding shaft 12, the seed crystal holding shaft 12 was rotated at a speed of 70 rpm so that the outer peripheral section of the bottom face of the seed crystal substrate 14 rotated at a speed of 29 mm/sec in Comparative Examples 4 and 5, at a speed of 92 mm/sec in Comparative Example 6, and at a speed of 59 mm/sec in Comparative Example 7, to grow a SiC crystal.

[Table 3]

TABLE 3

| Crystal growth conditions for Comparative Examples 4 to 7 | | | |
|---|---|---|---|
| Single crystal substrate diameter (mm) | Crucible inner diameter (mm) | Ratio K | Crystal growth holding time (h) |
| Comp. Example 4 | 8 | 70 | 0.11 | 16 |
| Comp. Example 5 | 8 | 70 | 0.11 | 24 |
| Comp. Example 6 | 25 | 70 | 0.36 | 31 |
| Comp. Example 7 | 16 | 100 | 0.16 | 12 |

The SiC single crystals grown in Comparative Examples 4 to 7 had a concave crystal growth surface with a thicker grown film thickness at the outer peripheral section of the grown crystal than at the center section. Table 4 shows the ratios M/P for the total length M of the {1-100} face with respect to the length P of the outer periphery of the growth surface, the crystal growth thicknesses at the center sections of the concave grown crystal surfaces, the growth surface diameters, the maximum angles of the growth surface inclination, and the presence or absence of inclusions, for the (000-1) growth surfaces of the SiC single crystals grown in Comparative Examples 4 to 7.

[Table 4]

TABLE 4

Properties of SiC single crystals grown in Examples 4 to 7

|  | M/P | Growth thickness (mm) | Growth surface diameter (mm) | Maximum angle of inclination (deg) | Inclusions |
|---|---|---|---|---|---|
| Comp. Example 4 | 1.00 | 3.6 | 14 | 4.7 | Present throughout outer periphery |
| Comp. Example 5 | 1.00 | 5.3 | 18 | 6.5 | Present throughout outer periphery |
| Comp. Example 6 | 0.94 | 6.3 | 34 | 7.2 | Present throughout outer periphery |
| Comp. Example 7 | 0.73 | 3.2 | 20 | 6.7 | Present throughout outer periphery |

Figure 15:
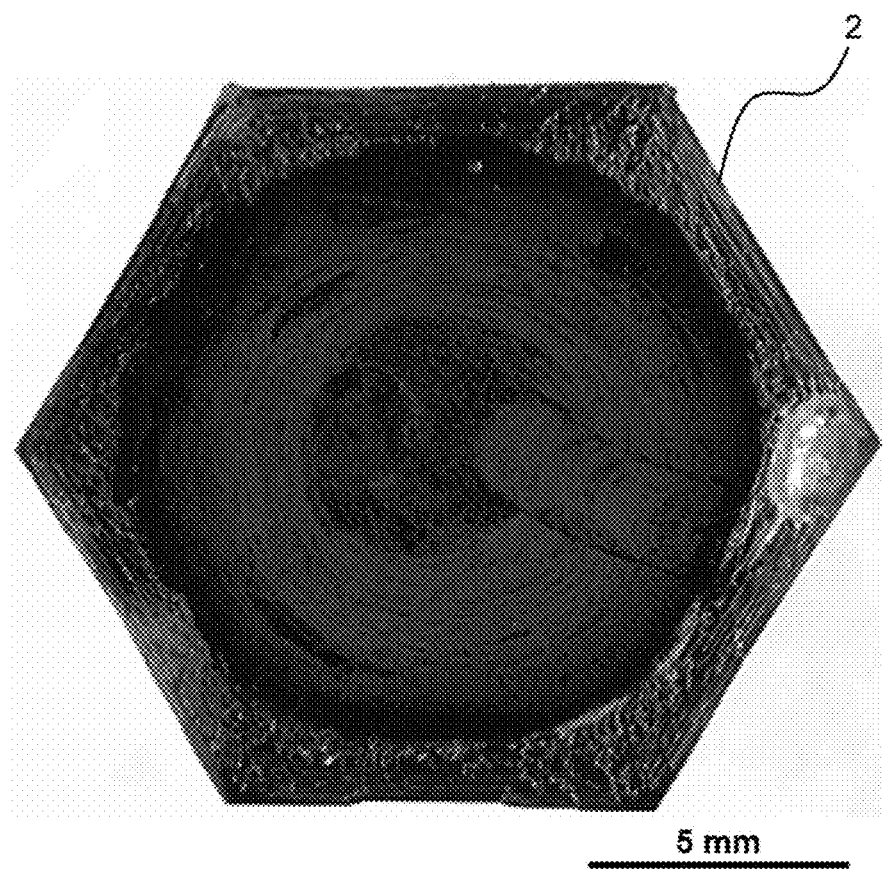
FIG. 15 is an external photograph of the growth surface of a SiC single crystal grown in a comparative example.

FIG. 15 is an external photograph of the SiC single crystal grown in Comparative Example 4, as observed from the growth surface. The (000-1) growth surface of the grown SiC single crystal was hexagonal, and all of the outer peripheral sections of the growth surface consisted of {1-100} faces, with the M/P ratio of 1.00.

Figure 16:
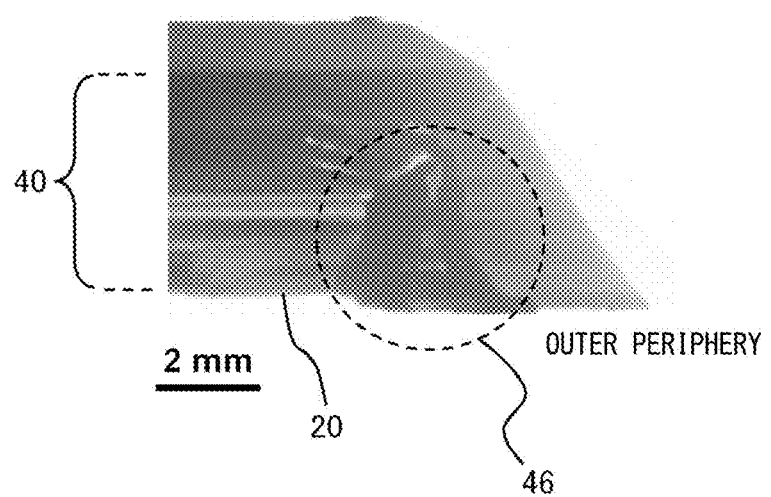
FIG. 16 is an optical microscope photograph of the cross-section of an obtained grown crystal.

FIG. 16 shows an optical microscope photograph of the cross-section of the outer peripheral section of the SiC single crystal grown in Comparative Example 4. Inclusions were present in substantially all of the outer peripheral sections of the obtained grown crystal.

Figure 17:
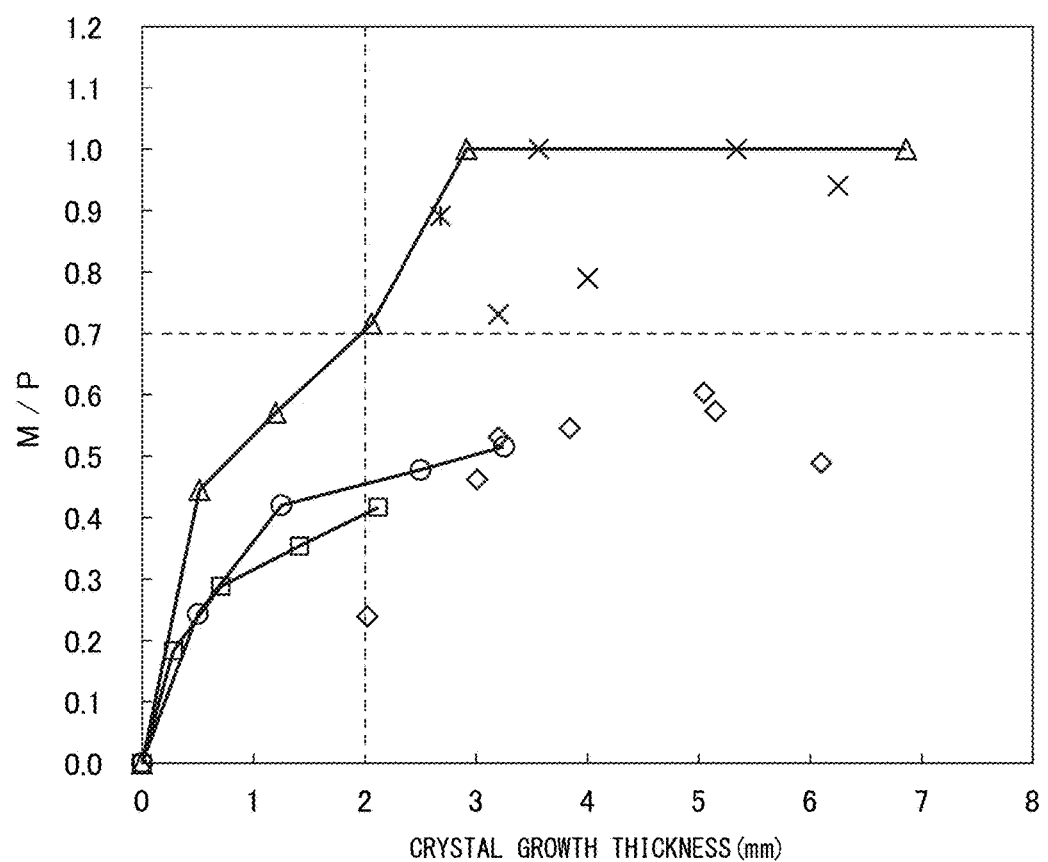
FIG. 17 is a graph showing the relationship between crystal growth thickness and M/P, for SiC crystals obtained in the examples and comparative examples.

FIG. 17 shows a graph representing the relationship between crystal growth thickness and M/P, for the SiC crystals obtained in Examples 1 to 9 and Comparative Examples 1 to 7. For Examples 1 and 2 and Comparative Example 1, the M/P values for the thicknesses during growth are also shown, in addition to the M/P values for the final thickness. Tables 5 to 9 summarize the results of Examples 1 to 9 and Comparative Examples 1 to 7. The "growth rate difference method" indicates whether or not a seed crystal holding shaft as shown in FIG. 5 was used, in order to lower the heat loss from the <11-20> direction to be less than the heat loss from the <1-100> direction.

[Table 5]

TABLE 5

Summary of results for Example 1

| Seed crystal diameter (mm) | Crucible inner diameter (mm) | K | Growth rate difference method | Growth thickness (mm) | M/P | Inclusions |
|---|---|---|---|---|---|---|
| 45 | 70 | 0.64 | Used | 0.0 | 0.00 | Absent |
|  |  |  |  | 0.5 | 0.24 | Absent |
|  |  |  |  | 1.3 | 0.42 | Absent |
|  |  |  |  | 2.5 | 0.48 | Absent |
|  |  |  |  | 3.3 | 0.53 | Absent |

[Table 6]

TABLE 6

Summary of results for Example 2

| Seed crystal diameter (mm) | Crucible inner diameter (mm) | K | Growth rate difference method | Growth thickness (mm) | M/P | Inclusions |
|---|---|---|---|---|---|---|
| 50 | 70 | 0.71 | Used | 0.0 | 0.00 | Absent |
|  |  |  |  | 0.3 | 0.18 | Absent |
|  |  |  |  | 0.7 | 0.29 | Absent |
|  |  |  |  | 1.4 | 0.35 | Absent |
|  |  |  |  | 2.1 | 0.42 | Absent |

[Table 7]

TABLE 7

Summary of results for Examples 3 to 9

|  | Seed crystal diameter (mm) | Crucible inner diameter (mm) | K | Growth rate difference method | Growth thickness (mm) | M/P | Inclusions |
|---|---|---|---|---|---|---|---|
| Example 3 | 45 | 70 | 0.64 | Used | 2.0 | 0.24 | Absent |
| Example 4 | 38 | 70 | 0.54 | Used | 3.0 | 0.46 | Absent |
| Example 5 | 45 | 70 | 0.64 | Used | 3.2 | 0.53 | Absent |
| Example 6 | 45 | 70 | 0.64 | Used | 3.8 | 0.55 | Absent |
| Example 7 | 45 | 70 | 0.64 | Used | 5.1 | 0.60 | Absent |
| Example 8 | 45 | 70 | 0.64 | Used | 5.2 | 0.57 | Absent |
| Example 9 | 45 | 70 | 0.64 | Used | 6.1 | 0.49 | Absent |

[Table 8]

TABLE 8

Summary of results for Comparative Example 1

| Seed crystal diameter (mm) | Crucible inner diameter (mm) | K | Growth rate difference method | Growth thickness (mm) | M/P | Inclusions |
|---|---|---|---|---|---|---|
| 12 | 70 | 0.17 | Used | 0.0 | 0.00 | Partially present in outer periphery |
|  |  |  |  | 0.5 | 0.44 | Partially present in outer periphery |
|  |  |  |  | 1.2 | 0.57 | Partially present in |

TABLE 8-continued

Summary of results for Comparative Example 1

| Seed crystal diameter (mm) | Crucible inner diameter (mm) | K | Growth rate difference method | Growth thickness (mm) | M/P | Inclusions |
|---|---|---|---|---|---|---|
| | | | | 2.1 | 0.72 | Partially present in outer periphery |
| | | | | 2.9 | 1.00 | Partially present in outer periphery |
| | | | | 6.9 | 1.00 | Partially present in outer periphery |

[Table 9]

TABLE 9

Summary of results for Comparative Examples 2 to 7

| | Seed crystal diameter (mm) | Crucible inner diameter (mm) | K | Growth rate difference method | Growth thickness (mm) | M/P | Inclusions |
|---|---|---|---|---|---|---|---|
| Comp. Example 2 | 25 | 70 | 0.36 | Used | 2.7 | 0.89 | Partially present in outer periphery |
| Comp. Example 3 | 50 | 70 | 0.71 | Not used | 4.0 | 0.79 | Present throughout outer periphery |
| Comp. Example 4 | 8 | 70 | 0.11 | Not used | 3.6 | 1.00 | Present throughout outer periphery |
| Comp. Example 5 | 8 | 70 | 0.11 | Not used | 5.3 | 1.00 | Present throughout outer periphery |
| Comp. Example 6 | 25 | 70 | 0.36 | Not used | 6.3 | 0.94 | Present throughout outer periphery |
| Comp. Example 7 | 16 | 100 | 0.16 | Not used | 3.2 | 0.73 | Present throughout outer periphery |

EXPLANATION OF SYMBOLS

1 Step-flow growth section
2 Crystal growth surface
3 Outer peripheral section formed by the {1-100} faces on {0001} growth surface
5 Recess on seed crystal holding shaft
6 Raised section on seed crystal holding shaft
8 Thermal insulating material
100 Single crystal production apparatus
10 Crucible
12 Seed crystal holding shaft
14 Seed crystal substrate
16 Onset axis plane of seed crystal substrate
18 Heat-insulating material
20 Concave crystal growth surface
22 High-frequency coil
22A Upper level high-frequency coil
22B Lower level high-frequency coil
24 Si—C solution
26 Quartz tube
28 Opening at top of crucible
34 Meniscus
40 SiC grown crystal
42 Cut grown crystal
46 Inclusion region in grown crystal

What is claimed is:

1. A method for producing a SiC single crystal in which a SiC seed crystal substrate having a {0001} face,
the SiC seed crystal substrate being held on a center portion of a seed crystal holding shaft, the seed crystal holding shaft including the center portion and a side portion that surrounds the center portion, the side portion having alternating recesses and raised sections, is contacted with a Si—C solution in a crucible,
the Si—C solution having a temperature gradient such that a temperature of the Si—C solution decreases from an interior of the Si—C solution toward a surface of the Si—C solution, to grow the SiC single crystal from the {0001} face of the SiC seed crystal substrate in a <11-20> direction and <1-100> direction and form a grown SiC single crystal, wherein the method comprises:
growing the SiC single crystal from the {0001} face of the SiC seed crystal substrate to a length of 2 mm or greater in the growth direction to form the grown SiC single crystal, and
prior to growing the SiC single crystal, configuring the seed crystal substrate and the seed crystal holding shaft to reduce heat loss from the <11-20> direction to be lower than heat loss from the <1-100> direction by bonding a top face of the seed crystal substrate to the center portion of the seed crystal holding shaft so that the <1-100> direction of the seed crystal substrate is oriented to coincide with the recesses of the seed crystal holding shaft, and the <11-20> direction of the seed crystal substrate is oriented to coincide with the raised sections of the seed crystal holding shaft; wherein a ratio S/C of a diameter S of the SiC seed crystal substrate to an inner diameter C of the crucible satisfies a relationship 0.50≤S/C<1.0.

2. The method for producing a SiC single crystal according to claim 1, wherein:

a total length M of an outer peripheral section formed by the {1-100} faces on the {0001} growth surface of the grown SiC single crystal, and a length P of an outer periphery of the growth surface of the grown SiC single crystal, satisfy the relationship M/P≤0.70.

3. The method for producing a SiC single crystal according to claim 2, wherein the grown SiC single crystal has a concave crystal growth surface.

4. The method for producing a SiC single crystal according to claim 3, wherein the maximum angle θ of the inclination of the concave crystal growth surface with respect to the onset axis plane of growth of the grown SiC single crystal is in the range of 0<θ≤8°.

5. The method for producing a SiC single crystal according to claim 1, wherein the method comprises forming a meniscus between the SiC seed crystal substrate and the Si—C solution.

6. The method for producing a SiC single crystal according to claim 5, wherein the method comprises controlling the temperature of the Si—C solution so that a temperature of the Si—C solution at the outer peripheral sections directly below an interface with the crystal growth surface is lower than a temperature of the Si—C solution at the center section directly below the interface with the crystal growth surface, and causing flow of the Si—C solution from the center section to the outer peripheral sections directly below the interface with the crystal growth surface.

7. The method for producing a SiC single crystal according to claim 1, wherein the method comprises controlling the temperature of the Si—C solution so that a temperature of the Si—C solution at the outer peripheral sections directly below an interface with the crystal growth surface is lower than a temperature of the Si—C solution at the center section directly below the interface with the crystal growth surface, and causing flow of the Si—C solution from the center section to the outer peripheral sections directly below the interface with the crystal growth surface.

8. The method for producing a SiC single crystal according to claim 1, wherein the SiC single crystal is grown by having the Si—C solution wet only the bottom face of the seed crystal substrate, forming a meniscus for crystal growth.

9. The method for producing a SiC single crystal according to claim 1, wherein no inclusions are present throughout the entire grown SiC single crystal.

* * * * *

UNITED STATES PATENT AND TRADEMARK OFFICE
CERTIFICATE OF CORRECTION

PATENT NO. : 10,450,671 B2
APPLICATION NO. : 15/023981
DATED : October 22, 2019
INVENTOR(S) : Hironori Daikoku et al.

Page 1 of 1

It is certified that error appears in the above-identified patent and that said Letters Patent is hereby corrected as shown below:

On the Title Page

Item (73), change:
"Assignees: TOYOTA JIDOSHA KABUSHIKI KAISHA, Toyota (JP); NIPPON STEEL & SUMITOMO METAL CORPORATION, Tokyo (JP)"
To:
-- Assignee: TOYOTA JIDOSHA KABUSHIKI KAISHA, Toyota (JP) --

Signed and Sealed this
Twenty-ninth Day of December, 2020

Andrei Iancu
*Director of the United States Patent and Trademark Office*